(12) United States Patent
de Lima

(10) Patent No.: US 8,474,572 B2
(45) Date of Patent: Jul. 2, 2013

(54) APPARATUS AND METHOD TO ATTENUATE VIBRATION AND ACOUSTIC NOISE

(75) Inventor: Washington de Lima, Florence, SC (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/218,075

(22) Filed: Aug. 25, 2011

(65) Prior Publication Data

US 2013/0048415 A1  Feb. 28, 2013

(51) Int. Cl.
*F16F 15/02* (2006.01)
*F16F 15/00* (2006.01)
*F16F 7/00* (2006.01)

(52) U.S. Cl.
USPC .......................................... 181/207; 181/290

(58) Field of Classification Search
USPC .................. 181/207, 208, 290, 284
See application file for complete search history.

(56) References Cited

U.S. PATENT DOCUMENTS

| | | | | |
|---|---|---|---|---|
| 2,173,797 A * | 9/1939 | Toohey et al. | ............... | 181/208 |
| 2,369,006 A * | 2/1945 | Banks | ........................... | 156/221 |
| 2,514,170 A * | 7/1950 | Walter et al. | ................... | 428/175 |
| 2,541,159 A * | 2/1951 | Geiger | .......................... | 181/208 |
| 3,026,224 A * | 3/1962 | Rogers, Jr. | .................... | 428/167 |
| 3,087,565 A * | 4/1963 | Kerwin, Jr. | ................... | 181/208 |
| 3,130,700 A * | 4/1964 | Peterson | ....................... | 114/20.1 |
| 3,160,549 A * | 12/1964 | Caldwell et al. | ........... | 428/317.3 |
| 3,420,553 A * | 1/1969 | Poxon et al. | ..................... | 285/49 |
| 3,833,086 A * | 9/1974 | Giraudeau | ...................... | 181/207 |
| 3,923,118 A * | 12/1975 | Johansen | ...................... | 181/286 |
| 4,190,131 A * | 2/1980 | Robinson | ...................... | 181/296 |
| 4,493,471 A * | 1/1985 | McInnis | ........................ | 248/580 |
| 4,527,371 A * | 7/1985 | Hagbjer | ..................... | 52/309.16 |
| 4,709,781 A * | 12/1987 | Scherzer | ....................... | 181/290 |
| 4,755,408 A * | 7/1988 | Noel | ............................. | 428/36.5 |
| 4,886,696 A * | 12/1989 | Bainbridge | .................... | 428/184 |
| 5,304,415 A * | 4/1994 | Kurihara et al. | .............. | 428/328 |
| 5,330,165 A * | 7/1994 | van Goubergen | ............. | 267/141 |
| 5,754,491 A * | 5/1998 | Cushman | .......................... | 367/1 |
| 6,174,587 B1 * | 1/2001 | Figge, Sr. | ...................... | 428/178 |
| 6,196,488 B1 * | 3/2001 | Sakata et al. | ................... | 242/388 |
| 6,298,963 B1 * | 10/2001 | Kim | ............................... | 188/379 |
| 6,951,264 B2 * | 10/2005 | Byma et al. | .................... | 181/286 |
| 7,011,181 B2 * | 3/2006 | Albin, Jr. | ....................... | 181/290 |
| 7,553,533 B2 * | 6/2009 | Manfredotti | .................. | 428/134 |
| 7,770,693 B2 * | 8/2010 | Uejima | .......................... | 181/294 |
| 8,104,593 B2 * | 1/2012 | Lin | ................................ | 188/372 |
| 8,113,495 B2 * | 2/2012 | Downey | ..................... | 267/140.4 |
| 8,261,558 B2 * | 9/2012 | Cao et al. | ....................... | 62/50.7 |

(Continued)

FOREIGN PATENT DOCUMENTS

FR    2685528 A1 *   6/1993

*Primary Examiner* — Edgardo San Martin
(74) *Attorney, Agent, or Firm* — The Small Patent Law Group; Dean D. Small

(57) ABSTRACT

An apparatus and method to attenuate vibration and acoustic noise are provided. One apparatus includes a first layer formed from a non-metal material having a predetermined level of resistance to deformation to define a frequency response based on a vibrating frequency. The non-metal material has a profile defined by at least one sinusoid. The apparatus also includes a second layer defining an absorption layer coupled to the first layer. The second layer adds a body of mass adjacent the first layer.

22 Claims, 5 Drawing Sheets

U.S. PATENT DOCUMENTS

2004/0238269 A1* 12/2004 Wang et al. .................. 181/202
2005/0241877 A1* 11/2005 Czerny et al. ................ 181/293
2005/0263346 A1* 12/2005 Nishimura .................... 181/290
2007/0031246 A1*  2/2007 Peng ......................... 415/173.1

* cited by examiner

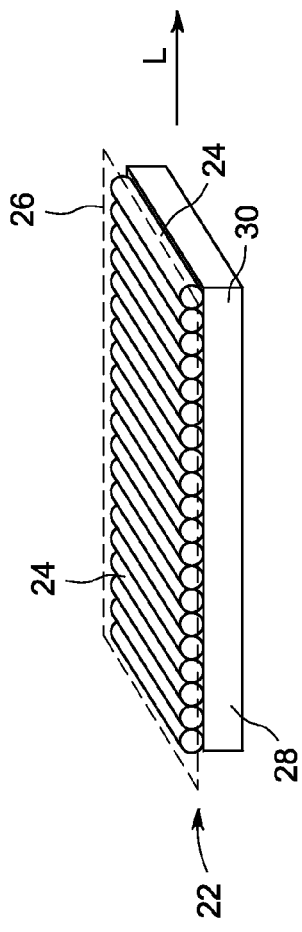
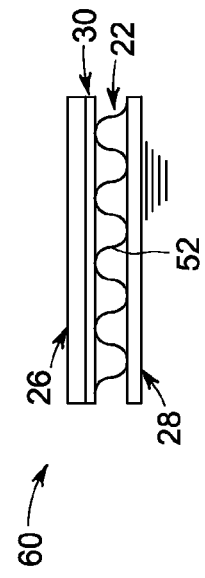
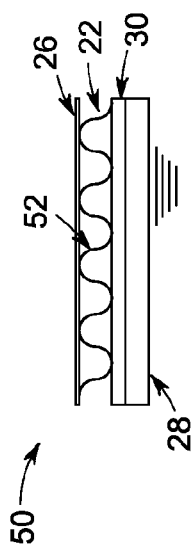
FIG. 1
FIG. 2
FIG. 3
FIG. 4
FIG. 5

APPARATUS AND METHOD TO ATTENUATE VIBRATION AND ACOUSTIC NOISE

BACKGROUND OF THE INVENTION

The subject matter disclosed herein relates generally to vibration and noise absorbers, and more particularly, to devices and methods for attenuating vibration and acoustic noise.

During operation of different machines and structures, vibrations and acoustic noise may be generated. For example, these machines and structures may radiate loud acoustic noise that is unpleasant in some circumstances. Additionally, high vibration of different components can cause damage to the machines or structures.

For example, during operation of magnetic resonance imaging (MRI) systems, noise is generated by the vibration of gradient coils in a static main magnetic field when the coils are pulsed during imaging operation. Additionally, eddy currents are also generated by the gradient coils on any metallic surface, such as radio-frequency (RF) coils, the magnet warm bore, and other metallic components of the MRI system. The interaction of the eddy currents with the main magnetic field also produces vibrations, which results in acoustic noise.

The acoustic noise is often unpleasant (e.g., in the 110-120 dBA range) and transmitted to the patient's ears through the MRI system, such as through the RF coils. Accordingly, this acoustic noise can become quite loud, which can further adversely affect patients that are already apprehensive about the scan to be performed. Additionally, the vibrations that are produced may potentially cause damage to the components of the MRI system.

Devices are known that provide vibration and acoustic noise control. These devices are formed having an attenuating structure to absorb the vibration or acoustic noise. However, these structures may not provide sufficient absorption for different applications and over a range of operating conditions and frequencies.

BRIEF DESCRIPTION OF THE INVENTION

In accordance with various embodiments, a vibration and sound attenuator is provided that includes a first layer formed from a non-metal material having a predetermined level of resistance to deformation to define a frequency response based on a vibrating frequency. The non-metal material has a profile defined by at least one sinusoid. The vibration and sound attenuator also includes a second layer defining an absorption layer coupled to the first layer. The second layer adds a body of mass adjacent the first layer.

In accordance with other embodiments, a vibration and sound attenuator is provided that includes a stiffness layer formed from a non-metal material having a surface following a sinusoidal path and an absorption layer coupled to the stiffness layer. The absorption layer adds a body of mass adjacent the stiffness layer for absorbing vibrations. The vibration and sound attenuator also includes a damping layer coupled to at least one of the stiffness layer or the absorption layer to further absorb the vibrations.

In accordance with yet other embodiments, a method for attenuating vibration and sound is provided. The method includes providing a stiffness layer formed from a non-metal material having a surface following a sinusoidal path. The method also includes providing an absorption layer and coupling the absorption layer to the stiffness layer. The absorption layer adds a body of mass adjacent the stiffness layer for absorbing vibrations. The method further includes providing a damping layer and coupling the damping layer to at least one of the stiffness layer or the absorption layer to further absorb the vibrations.

BRIEF DESCRIPTION OF THE DRAWINGS

FIG. 1 is a side elevation view showing a cross-section of a hybrid distributed vibration and sound attenuator formed in accordance with one embodiment.

FIG. 2 is a side elevation view showing a cross-section of a hybrid distributed vibration and sound attenuator formed in accordance with another embodiment.

FIG. 3 is a perspective view of a cross-section of a hybrid distributed vibration and sound attenuator formed in accordance with an embodiment.

FIG. 4 is a side elevation view showing a cross-section of a hybrid distributed vibration and sound attenuator formed in accordance with another embodiment.

FIG. 5 is a side elevation view showing a cross-section of a hybrid distributed vibration and sound attenuator formed in accordance with another embodiment.

DETAILED DESCRIPTION OF THE INVENTION

Figure 6:
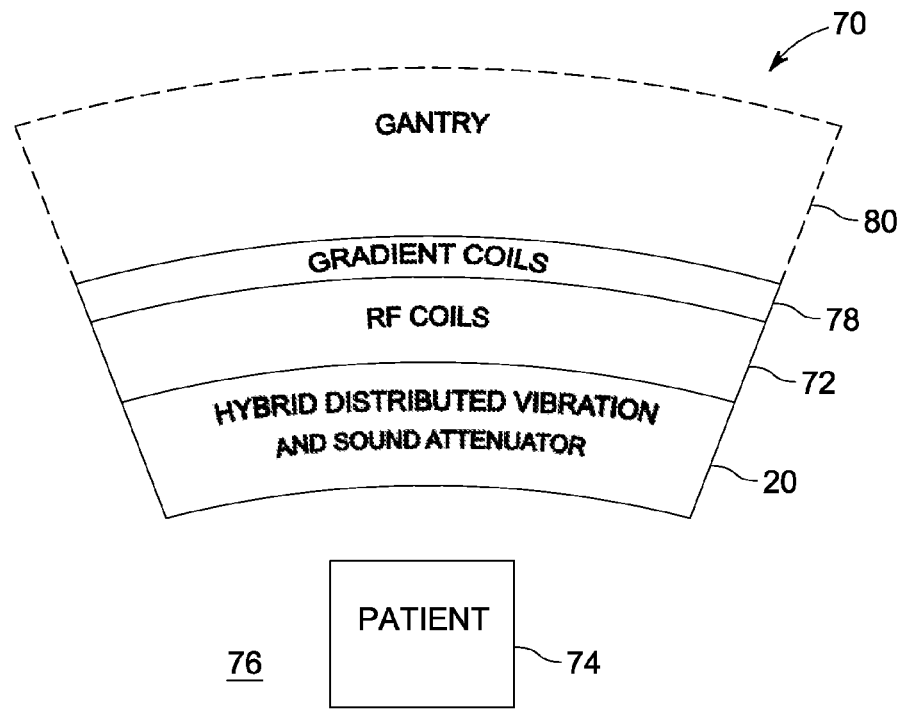
FIG. 6 is a simplified block diagram illustrating a hybrid distributed vibration and sound attenuator formed in accordance with various embodiments in one configuration within a magnetic resonance imaging (MRI) system.

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware. Thus, for example, one or more of the functional blocks may be implemented in a single piece of hardware or multiple pieces of hardware. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide apparatus and methods to attenuate vibration and acoustic noise. In particular, various embodiments provide a hybrid distributed vibration and sound attenuator formed from a multi-layer structure. By practicing various embodiments, increased attenuation of vibration and/or acoustic noise is provided.

One embodiment of a hybrid distributed vibration and sound attenuator 20 is shown in FIG. 1. FIG. 1 is a side elevation view showing a cross-section of the hybrid distributed vibration and sound attenuator 20. The hybrid distributed vibration and sound attenuator 20 in various embodiments is a multi-layer structure having two or more layers. In the illustrated embodiment, a first layer 22 is formed to create a profile having a thickness over a defined area. The first layer 22 may be configured or tuned for operation to define a frequency response of the attenuating structure to absorb, for example, vibration or acoustic noise at one or more frequencies. For example, in a magnetic resonance imaging (MRI) application, the first layer is formed having a frequency response based on the vibrating frequency of one or more components of the MRI system to which the hybrid distributed vibration and sound attenuator 20 is attached, such as radio-frequency (RF) coils, a magnet warm bore, and/or other metallic components of the MRI system.

The first layer 22 may be configured or tuned for a particular frequency response by forming the layer from a type of material or a stiffness providing a desired or required frequency response. In various embodiments, the first layer 22 is formed from a plurality of rods 24 (illustrated as cylindrical rods) that are formed in some embodiments from a non-metallic material, which may be based on a desired or required stiffness/unit area. The stiffness profile for the first layer 22 in some embodiments is defined by the material used to form the rods 24 or the number or size of the rods 24 used, which changes the stiffness per unit area.

It should be noted that the rods 24 may be solid rods or hollow rods/tubes or a combination thereof. In one embodiment, the rods 24 are formed from rubber or another elastomer. For example, the rods 24 may be formed from a material having a generally low Young's modulus (e.g., 0.01-4 gigapascals (GPa)) and generally higher yield strain (e.g., 25-100 MPa yield strength). It also should be noted that although the rods 24 are shown as cylindrical and having a circular cross-section, other shapes and configurations are contemplated, for example, oval, pentagonal, hexagonal, octagonal, among others. The change in cross-sectional shape also changes the stiffness/area (k'/area) for the first layer 22, where k is the stiffness, which is a measure of the resistance to deformation provided by the first layer 22. For example, the first layer 22 may be formed from different elastic bodies that provide different levels of resistance to deformation.

Figure 8:
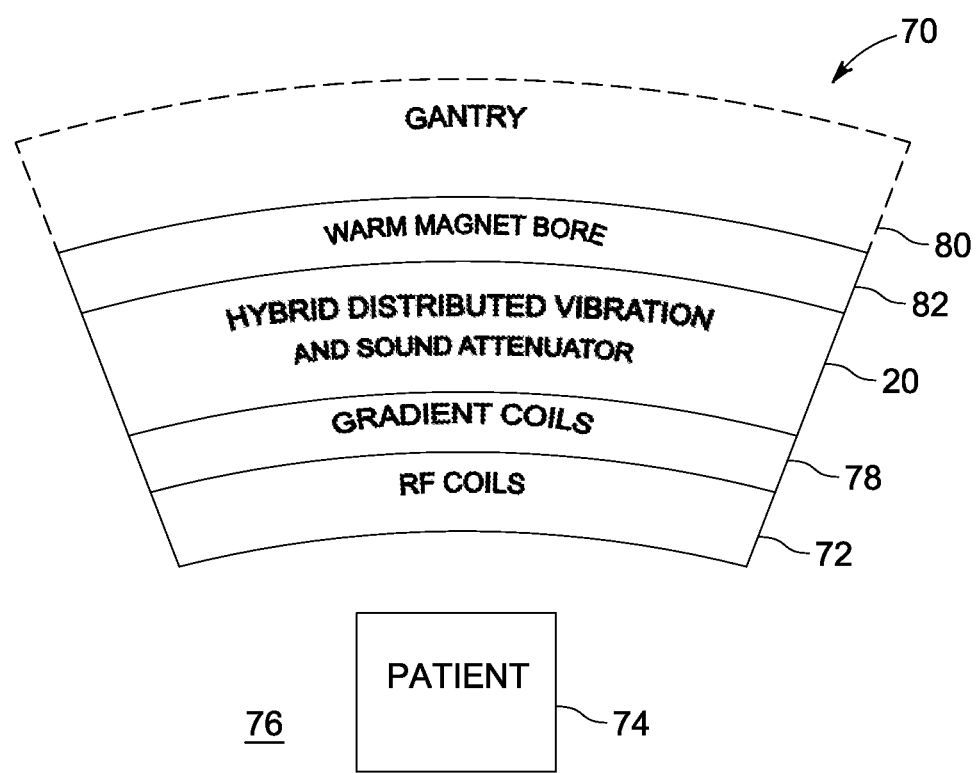
FIG. 8 is a simplified block diagram illustrating a hybrid distributed vibration and sound attenuator formed in accordance with various embodiments in another configuration within a MRI system.

Thus, the rods 24 of the first layer 22 define a non-planar structure having a "figure-8" profile. In particular, the profile of the first layer 22 is formed by the rods 24 that are defined by a multiple sinusoid profile. For example, the top and bottom surfaces for the first layer 24 defined by tops and bottoms of the rods 24 follow at least one sinusoidal type path.

The first layer 22 is coupled to a second layer 26. For example, the rods 24 may be coupled by an adhesive or glue, such as a suitable epoxy that may be selected based on the operating environment for the hybrid distributed vibration and sound attenuator 20. However, the various components, such as the first layer 22 and second layer 26 may be coupled together using any suitable coupling means, such as by mechanical fastening (e.g., a bracket).

The second layer 26 in various embodiments is an absorption layer (m'/area layer), which may be formed from a planar sheet of material have a defined thickness. For example, the second layer 26 may be formed from a metal, a non-metal or a composite material. In various embodiments, the second layer 26 may be formed from steel, aluminum, lead, a fiber reinforced plastic or glass. The second layer 26 may be formed from any material that adds mass to the top of the hybrid distributed vibration and sound attenuator 20.

Thus, in various embodiments, the first layer 22 has a low stiffness per area that in some embodiments can be electrically activated. It should be noted that the first layer 22 optionally may be formed from ceramics or other structures, such as an electromechanical device. In general, one or more layers of material may be used to attenuate vibration and acoustic noise. The second layer 26 is a layer defining a mass that can distribute vibration, which may extend along all or a portion of the first layer 22. The thickness or type of material selected for the second layer 26 may be based on the structure to which the hybrid distributed vibration and sound attenuator 20 is to be attached to provide different response properties (which may include one or more frequency responses). The thickness, size or weight of the second layer 26 may also be selected based on the structure to which the hybrid distributed vibration and sound attenuator 20 is to be attached.

It should be realized that multiple first and/or second layers 22 and 26 may be stacked together in an alternating arrangement, in multiples, or a combination thereof. Thus, different layers or sets of layers may be separately tuned.

The hybrid distributed vibration and sound attenuator 20 may be attached to any structure 28, such as any structure that may vibrate. Accordingly, in operation the hybrid distributed vibration and sound attenuator 20 is attached to the structure 28 using any suitable means, which may be a glue or mechanical fastener, to attenuate vibration and acoustic noise, such as at predetermined frequencies (e.g., between 500 Hz and 1000 Hz).

It should be noted that the hybrid distributed vibration and sound attenuator 20 may be coupled directly or indirectly to the structure 28. For example, the hybrid distributed vibration and sound attenuator 20 may be coupled directly to the structure 28 such that the hybrid distributed vibration and sound attenuator 20 is adjacent to and abuts the structure 28 (e.g., in physical contact with the structure 28). However, in other embodiments, the hybrid distributed vibration and sound attenuator 20 is indirectly coupled to the structure 28, for example, having one or more structures or components therebetween.

In various embodiments, a damping material is added to form a hybrid distributed vibration and sound attenuator 40, which may be formed to include one or more layers of the damping material. For example, as shown in FIG. 2, a damping layer 30 is provided between the first layer 22 and the structure 28. The damping layer 30 may be coupled to the first layer 22 using any suitable means, such as glue or a mechanical fastener.

The damping layer 30 is formed and configured in various embodiments to provide additional attenuation of vibration and/or acoustic noise. The damping layer 30 may be formed from any suitable material and at a predetermined thickness, for example, as a planar sheet of damping material. For example, in various embodiments, the damping layer 30 is formed from any suitable viscoelastic material that provides vibration absorption. For example, the damping layer 30 may be formed from a polymer, such as an amorphous polymer, a semicrystalline polymer, or a biopolymer, or a bitumen material, among others. Thus, the damping layer 30 in this embodiment is a vibration attenuation layer that has both viscous and elastic characteristics when experiencing deformation. It should be noted that the damping layer 30 may be formed from one or more layers of damping material, which may be the same or different. Additionally, more than one damping layer 30 may be provided such as to define a constrained damping layer structure.

Thus, the damping layer 30 in various embodiments provides increased attenuation of vibration and/or acoustic noise over what otherwise would be expected.

FIG. 3 illustrates the hybrid distributed vibration and sound attenuator 40 wherein the second layer 26 is shown in phantom and the damping layer 30 is shown in dashed lines. It should be noted that the rods 24 may be aligned in parallel to each other or offset from one another. Additionally, although the rods 24 are shown as arranged generally perpendicular to the longitudinal axis (L) of the arrangement, the rods may be arranged at an oblique angle transverse to the axis L. Also, although the rods 24 are shown as generally adjacent to each other with no gaps therebetween, spacing may be provided between one or more of the rods 24, which may be an equal or unequal spacing.

It also should be noted that the damping layer 30 may be positioned at different locations within the hybrid distributed vibration and sound attenuator 20. For example, the damping layer 30 may be positioned between the first and second layers 22 and 26.

Variations and modifications are contemplated. For example, a hybrid distributed vibration and sound attenuator 50 as shown in FIG. 4 may be provided. It should be noted that like numbers represent like parts in the various embodiments. The hybrid distributed vibration and sound attenuator 50 has a different first layer 22 than the hybrid distributed vibration and sound attenuator 20 and the hybrid distributed vibration and sound attenuator 40. In particular, the hybrid distributed vibration and sound attenuator 50 includes a first layer 22 formed from a non-planar structure. It should be noted that the first layer 22 may be formed from the same material(s) as described herein with respect to other described embodiments.

In one embodiment, as shown in FIG. 4, the first layer 22 is formed from a sinusoidal shaped structure 52, for example, a rubber body having a smooth repetitive oscillation in shape. The height and width of the oscillations may be changed to provide different frequency response profiles. Additionally, the thickness of the body forming the sinusoidal shaped structure 52 may be changed.

Thus, in this embodiment, shape of the first layer 22 is defined by a sinusoid. However, it should be noted that other repetitive shaped structures may be provided. For example, a square shaped body, a triangular shaped body, or a saw tooth shaped body, among others, may define the first layer 22.

In the illustrated embodiment, the damping layer 30 is provided between the first layer 22 and the structure 28 to which the hybrid distributed vibration and sound attenuator 50. However, as shown in FIG. 5, illustrating a hybrid distributed vibration and sound attenuator 60, the damping layer 30 may be provided between the first layer 22 and the second layer 26. The damping layer 30 may be formed from any suitable material as described herein.

The various embodiments may be implemented in any type of system, such as where the structure 28 vibrates and/or produces acoustic noise (or any type of sound). For example, in one embodiment, the system is an MRI system 70, a portion of which is shown in FIG. 6, with the hybrid distributed vibration and sound attenuator 20 coupled to an RF coil 72. The hybrid distributed vibration and sound attenuator 20 in this embodiment is positioned radially inward from the RF coil 72.

Accordingly, the hybrid distributed vibration and sound attenuator 20 is the closest surface to a patient 74, thereby defining the innermost surface of a bore 76 of the MRI system 70. It should be noted that although this embodiment, or any embodiment, is described in connection with a particular attenuator, which in this example is the hybrid distributed vibration and sound attenuator 20, any of the hybrid distributed vibration and sound attenuators described herein or contemplated hereby may be used.

In operation, the hybrid distributed vibration and sound attenuator 20 attenuates vibration and acoustic noise or sound generated by the MRI system 70 to reduce or eliminate the vibration and/or acoustic noise or sound from penetrating into the bore 76. For example, airborne noise generated by the MRI system 70, such as generated by gradient coils 78 that are also supported on a gantry 80 of the MRI system 70, are blocked, either partially or completely by the hybrid distributed vibration and sound attenuator 20. Additionally, noise created by the eddy currents on the RF coil 72 from pulsing of the gradient coils 78 are also reduced or eliminated by the hybrid distributed vibration and sound attenuator 20. Accordingly, the hybrid distributed vibration and sound attenuator 20 may be tuned to have a frequency response profile based on the vibration or acoustic noise generated by the RF coil 72 and/or the gradient coils 78. The gradient coils 78 may be frequency response tuned to one or more frequencies corresponding to the vibration or acoustic noise generated by the RF coil 72 and/or the gradient coils 78.

In various embodiments the hybrid distributed vibration and sound attenuator 20 may be mechanically coupled or decoupled from the RF coil 72 and any other vibrating structure within the MRI system 70, such as the gradient coils 78. Thus, the hybrid distributed vibration and sound attenuator 20 may be coupled or mounted to a vibrating or a non-vibrating portion or component of the MRI system 70. It should be noted that the hybrid distributed vibration and sound attenuator 20 may be sized and shaped to conform to the dimensions of the MRI system 70, for example, having a generally arcuate shape.

It also should be noted that the hybrid distributed vibration and sound attenuator 20 can provide another level or layer of safety protection to the patient 74. For example, the hybrid distributed vibration and sound attenuator 20 also may provide protection from burn hazards arising from electrical and/or thermal breakdown of capacitors, inductors, diodes, high power cables, among other components, of the MRI system 70 that can generate high levels of heat.

Thus, the hybrid distributed vibration and sound attenuator 20 may define the innermost radial surface of the bore 76 of the MRI system 70 shown in FIG. 6. It should be appreciated that although the MRI system 70 may be a single modality imaging system, the various embodiments may be implemented in or with multi-modality imaging systems, such as being combined with another system capable of generating images, particularly of a human. Moreover, the various embodiments are not limited to medical imaging systems for imaging human subjects, but may include veterinary or non-medical systems for imaging non-human objects, luggage, etc. Additionally, the various embodiments may be implemented in connection with any type of vibrating structure, such as within a vehicle, building, bridge, etc.

Figure 7:
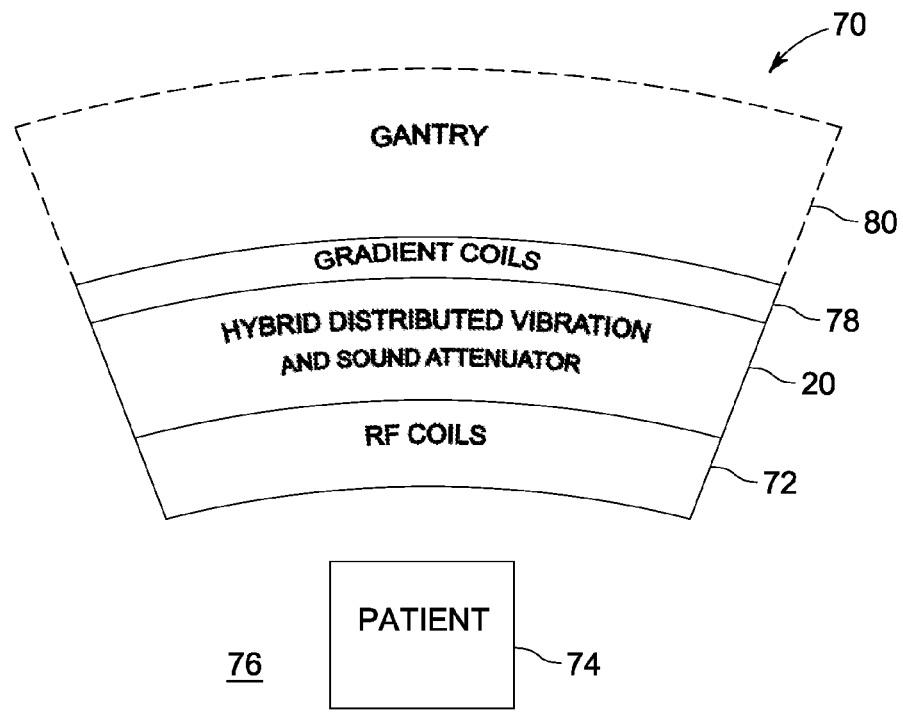
FIG. 7 is a simplified block diagram illustrating a hybrid distributed vibration and sound attenuator formed in accordance with various embodiments in another configuration within a MRI system.

It should be noted that the hybrid distributed vibration and sound attenuator 20 may positioned within different portions of a system, for example, the MRI system 70. For example, the hybrid distributed vibration and sound attenuator 20 may be positioned between the gradient coils 78 and the RF coil 72 as shown in FIG. 7. In still a further embodiment, the hybrid distributed vibration and sound attenuator 20 may be positioned between a magnet warm bore 82 and the gradient coils 78 as shown in FIG. 8.

The dimensions and configuration of the hybrid distributed vibration and sound attenuator 20, for example, the length, shape and/or size of the hybrid distributed vibration and sound attenuator 20 may be selected or optimized to increase or maximize the effect of the hybrid distributed vibration and sound attenuator 20 on the vibration and acoustic noise transmission (e.g., vibration noise) to or within the bore 76 and heard by the patient 74.

The various components, including the hybrid distributed vibration and sound attenuator 20, are mounted or supported using suitable mechanisms. For example, the RF coil 72 may be coupled to the gradient coils 78 using suitable mounting structures (e.g., support brackets).

The various embodiments may be implemented in connection with different types of MRI systems. For example, the various embodiments may be implemented with the MRI system 70 shown in FIG. 9. It should be appreciated that although the system 70 is illustrated as a single modality imaging system, the various embodiments may be implemented in or with multi-modality imaging systems. The system 70 is illustrated as an MRI imaging system and may be combined with different types of medical imaging systems or any other system capable of generating images, particularly of a human. Moreover, the various embodiments are not limited to medical imaging systems for imaging human subjects, but may include veterinary or non-medical systems for imaging non-human objects, luggage, etc.

Figure 9:
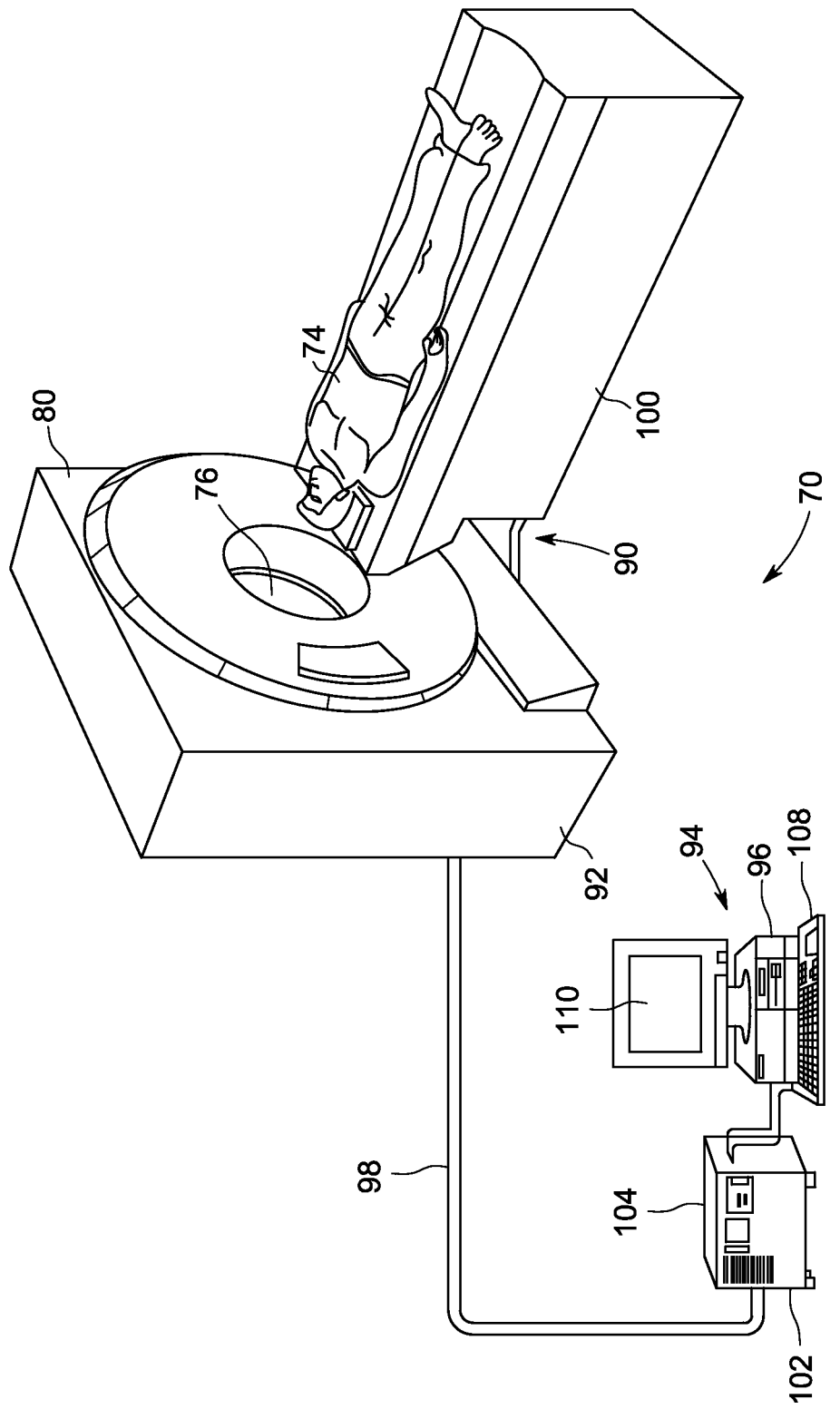
FIG. 9 is a pictorial view of an MRI system in which a hybrid distributed vibration and sound attenuator formed in accordance with various embodiments may be implemented.

Referring specifically to FIG. 9, the MRI system 70 includes an imaging portion 90 having an imaging unit 92 (e.g., imaging scanner) and a processing portion 94 that may include a processor 96 or other computing or controller device. In particular, the imaging unit 92 enables the MRI system 70 to scan an object or the patient 74 to acquire image data, which may be image data of all or a portion of the object or patient 74. The imaging unit 92 includes the gantry 80 having one or more imaging components (e.g., magnets or magnet windings, as well as coils within the gantry 80) that allow acquisition of the image data. Additionally, one or more embodiments of the hybrid distributed vibration and sound attenuator may be mounted within or to the gantry 80.

In multi-modality imaging systems, in addition to the magnet(s) for magnetic resonance imaging, an x-ray source and detector for computed-tomography imaging, or gamma cameras for nuclear medicine imaging may be provided. The imaging components produce signals that represent image data that is communicated to the processing portion 94 via a communication link 98 that may be wired or wireless. During an imaging scan by the imaging unit 92, the gantry 80 and the imaging components mounted thereon or therein may remain stationary or rotate about or along a center of rotation defining an examination axis through the bore 76. The patient 74 may be positioned within the gantry 80 using, for example, a motorized table 100.

In operation, an output of one or more of the imaging components is transmitted to the processing portion 94, and vice versa, which may include transmitting signals to or from the processor 96 through a control interface 102. The processor 96 also may generate control signals for controlling the position of the motorized table 100 or imaging components based on user inputs or a predetermined scan. During a scan, image data, such as magnetic resonance image data from the imaging components may be communicated to the processor 96 through a data interface 104 via the control interface 102, for example, as acquired by one or more surface coils (e.g., a torso surface coil array).

The processing portion 94 and associated hardware and software used to acquire and process data may be collectively referred to as a workstation 106. The workstation 106 includes a keyboard 108 and/or other input devices such as a mouse, a pointer, and the like, and a display device 110. The display device 110 displays image data and may accept input from a user if a touchscreen is available.

Thus, various embodiments provide a hybrid distributed vibration and sound attenuator that reduces vibration and/or acoustic noise, for example, in one embodiment, transmitted to or within the bore of an MRI system. Accordingly, the acoustic noise experienced by a patient being scanned is lower.

Figure 10:
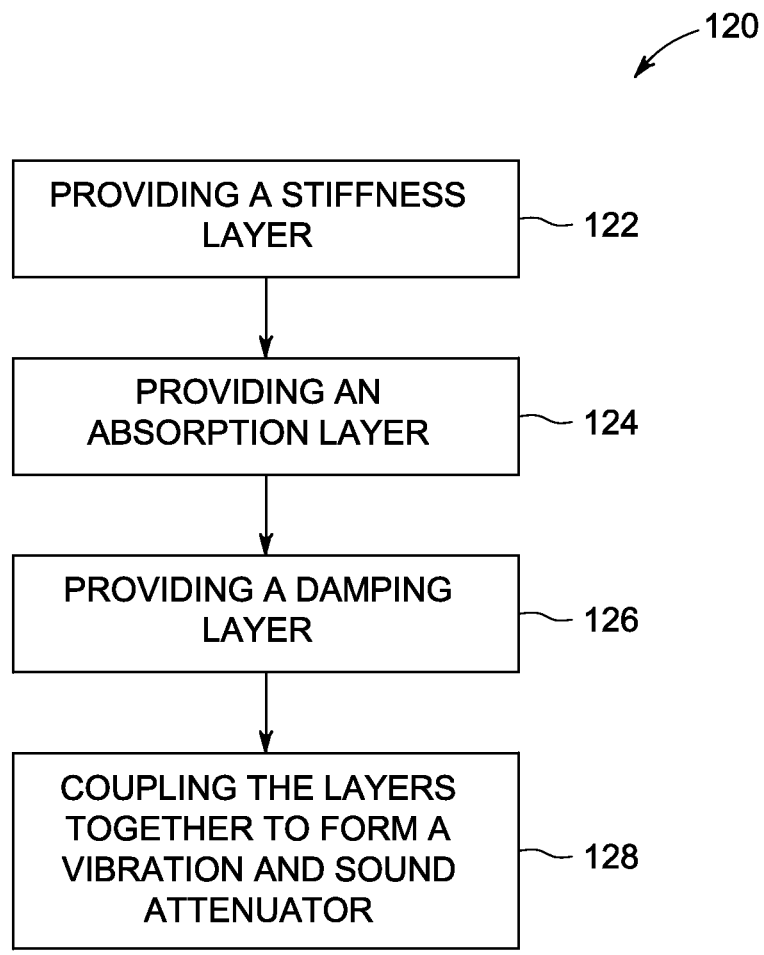
FIG. 10 is a flowchart of a method for forming a hybrid distributed vibration and sound attenuator in accordance with various embodiments.

A method 120 for forming a hybrid distributed vibration and sound attenuator is also provided as shown in FIG. 10. In particular, the method 120 includes providing a stiffness layer at 122 and providing an absorption layer at 124. For example, the stiffness layer may be formed from a non-metal material having a predetermined level of resistance to deformation to define a frequency response based on a vibrating frequency, with the non-metal material having a profile defined by at least one sinusoid. The absorption layer may be formed from a material that defines an absorption layer wherein the absorption layer provides a body of mass.

The method 120 also includes providing a damping layer at 126. The damping layer may be formed from a viscoelastic material providing vibration absorption. The stiffness layer, the absorption layer and the damping layer are coupled at 128 to form a vibration and sound attenuator, for example, the hybrid distributed vibration and sound attenuator 20. It should be noted that the layers may be coupled in any order or arrangement and at different times.

The various embodiments and/or components, for example, the modules, elements, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as an optical disk drive, solid state disk drive (e.g., flash RAM), and the like. The storage device may also be other similar means for loading computer programs or other instructions into the computer or processor.

As used herein, the term "computer" or "module" may include any processor-based or microprocessor-based system including systems using microcontrollers, reduced instruction set computers (RISC), application specific integrated circuits (ASICs), field-programmable gate arrays (FPGAs), graphical processing units (GPUs), logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments. The set of instructions may be in the form of a software program, which may form part of a tangible non-transitory computer readable medium or media. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software", "firmware" and "algorithm" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A vibration and sound attenuator comprising:
    a plurality of first layers formed from a non-metal material having a predetermined level of resistance to deformation to define a frequency response based on a vibrating frequency, the non-metal material having a profile defined by at least one sinusoid, wherein the plurality of first layers are configured in a stacked arrangement, and at least two of the plurality of first layers are tuned differently to define different frequency responses; and
    a second layer defining an absorption layer coupled to at least one of the first layers, the second layer adding a body of mass adjacent the first layer.

2. The vibration and sound attenuator of claim 1, wherein the plurality of first layers comprises a plurality of adjacent and parallel aligned cylindrical rods.

3. The vibration and sound attenuator of claim 2, wherein the cylindrical rods are formed from an elastomer.

4. The vibration and sound attenuator of claim 1, wherein the second layer is coupled to a top of at least one of the plurality of first layers and a bottom of one of the plurality of first layers is coupled to a structure that experiences vibration.

5. The vibration and sound attenuator of claim 1, further comprising a damping layer, wherein one of the, plurality of first layers is positioned between the second layer and the damping layer.

6. The vibration and sound attenuator of claim 1, further comprising a damping layer positioned between one of the plurality of first layers and the second layer.

7. The vibration and sound attenuator of claim 1, wherein the frequency response is based on a vibrating frequency of at least one of a radio-frequency (RF) coil or a gradient coil of a magnetic resonance imaging (MRI) system.

8. The vibration and sound attenuator of claim 1, further comprising a damping layer formed from a viscoelastic material providing vibration absorption.

9. The vibration and sound attenuator of claim 1, wherein the plurality of first layers is formed from a material having a body defined by a profile following a single sinusoidal path.

10. The vibration and sound attenuator of claim 1, wherein the plurality of first layers comprises a stiffness layer.

11. The vibration and sound attenuator of claim 1, further comprising a plurality of second layers, wherein the plurality of first layers and the plurality of second layers are in an alternating arrangement.

12. The vibration and sound attenuator of claim 11, further comprising a plurality of damping layers.

13. A vibration and sound attenuator comprising:
    a plurality of stiffness layers formed from a non-metal material having a surface following a sinusoidal path, wherein the plurality of stiffness layers are configured in a stacked arrangement and at least two of the plurality of stiffness layers are tuned differently to define different frequency responses;
    an absorption layer coupled to at least one of the plurality of stiffness layers, the absorption layer adding a body of mass adjacent the stiffness layer for absorbing vibrations; and
    a damping layer coupled to at least one of the stiffness layer or the absorption layer to further absorb the vibrations.

14. The vibration and sound attenuator of claim 13, wherein the plurality of stiffness layers is formed from a non-metal and the absorption layer is formed from a metal.

15. The vibration and sound attenuator of claim 13, wherein the plurality of stiffness layers comprises a plurality of adjacent and parallel aligned cylindrical rods.

16. The vibration and sound attenuator of claim 13, wherein the absorption layer is coupled to a top of at least one of the plurality of stiffness layers and a bottom of one of the plurality of stiffness layers is coupled to a structure that creating the vibrations.

17. The vibration and sound attenuator of claim 13, wherein one of the plurality of stiffness layers is positioned between the absorption layer and the damping layer.

18. The vibration and sound attenuator of claim 13, wherein the damping layer is positioned between one of the plurality of stiffness layers and the absorption layer.

19. The vibration and sound attenuator of claim 13, wherein the plurality of stiffness layers is formed from a non-metal material having a predetermined level of resistance to deformation to define the frequency responses based on a vibrating frequency, wherein the frequency responses are based on a vibrating frequency of at least one of a radio-frequency (RF) coil or a gradient coil of a magnetic resonance imaging (MRI) system.

20. A method for attenuating vibration and sound, the method comprising:

providing a plurality of stiffness layers formed from a non-metal material having a surface following a sinusoidal path, wherein the plurality of stiffness layers are configured in a stacked arrangement and at least two of the plurality of stiffness layers are tuned differently to define different frequency responses;

providing an absorption layer and coupling the absorption layer to at least one of the plurality of stiffness layers, the absorption layer adding a body of mass adjacent the stiffness layer for absorbing vibrations; and providing a damping layer and coupling the damping layer to at least one of the plurality of stiffness layers or the absorption layer to further absorb the vibrations.

21. The vibration and sound attenuator of claim 1, further comprising a plurality of second layers, wherein at least one of (i) the plurality of first layers or (ii) the plurality of second layers is in an adjacent arrangement having multiple first layers adjacent each other or multiple second layers adjacent each other.

22. The vibration and sound attenuator of claim 1, wherein at least one of the plurality of first layers comprises an electromechanical device.

* * * * *